US007068005B2

(12) United States Patent
Baker

(10) Patent No.: US 7,068,005 B2
(45) Date of Patent: Jun. 27, 2006

(54) MOTOR DRIVE WITH DAMPER

(75) Inventor: Donal E. Baker, Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 10/929,804

(22) Filed: Aug. 30, 2004

(65) Prior Publication Data

US 2006/0043920 A1 Mar. 2, 2006

(51) Int. Cl.
*G05B 5/01* (2006.01)

(52) U.S. Cl. ........................ 318/611; 318/700; 318/702

(58) Field of Classification Search ................ 318/611, 318/700, 702, 727

See application file for complete search history.

(56) References Cited

U.S. PATENT DOCUMENTS 5,661,390 A * 8/1997 Lipo et al. .................. 318/803
5,666,255 A * 9/1997 Muelleman ................. 361/111
5,686,806 A * 11/1997 Hibbard ...................... 318/800
5,990,654 A * 11/1999 Skibinski et al. ........... 318/800
6,775,157 B1 * 8/2004 Honda ......................... 363/39
6,898,092 B1 * 5/2005 Briere et al. .................. 363/39

* cited by examiner

*Primary Examiner*—P. Austin Bradley
*Assistant Examiner*—Erick Glass
(74) *Attorney, Agent, or Firm*—Carlson, Gaskey & Olds

(57) ABSTRACT

A motor controller having a damper that dampens resonance in a motor drive of a common mode filter to prevent it from becoming over excited by operation of the motor drive at a resonant frequency of the common mode filter. The damper is connected to an output feeder line of a motor drive in the motor controller and provides a common mode path to ground for the common mode filter. Thus, even if the motor drive is operating at a resonant frequency of the common mode filter, the resulting resonance in the common mode filter is attenuated by rather than amplified by the common mode filter, thereby preventing the common mode filter from excessive excitation.

14 Claims, 2 Drawing Sheets

MOTOR DRIVE WITH DAMPER

TECHNICAL FIELD

The present invention relates to motor controllers, and more particularly to a motor control circuit for filtering a motor drive output.

BACKGROUND OF THE INVENTION

Motor controllers are used with motors to provide variable and controllable speed for various applications. The same motor controller may be used for different applications in the same system; for example, a motor controller in an aircraft may be used to start a main engine and to drive an environmental control system.

To minimize the size and weight of the motor used in a given application, it is common to drive the motor at high rotational speeds. This in turn requires the motor controller to operate at relatively high frequencies. To do this, the motor controller may include a motor drive having switches, such as switching transistors, with switching frequencies that can handle the rotational speed of the motor. However, it is also necessary to prevent excessive radiated electromagnetic interference (EMI) emissions due to the high frequency operation of the motor drive. Although shielding of input and/or output lines of the motor drive is often used to control EMI emissions, there are weight-sensitive applications, such as aircraft applications, the extra weight and heat retention caused by the shields would be unacceptable.

Common mode filtering is therefore considered a more desirable way to control radiation emissions from the motor drive. Common mode filtering controls the common mode voltage at the input and/or output feeders of the motor drive. Common mode voltages normally occur at the output lines of the motor drive. As is known in the art, inverter switches, such as insulated gate bipolar transistors (IGBTs), operate at a chop frequency typically ranging in the thousands of kHz and at amplitudes of hundreds of volts. The common mode elements of the chop frequency and its harmonics must be attenuated to a tiny fraction of the original chop voltage (e.g., on the order of millivolts) to reduce EMI emissions to required levels.

Typically, the input feeders of the motor drive are grounded to a system ground (e.g., an airframe) and the output feeders (i.e., the lines going to the motor) float and stay electrically isolated from the system ground. Common mode filtering is typically realized in such a system by adding a common mode filter, such as a low pass filter, to the output feeders of the motor drive.

The load for the motor drive is typically an ungrounded motor, making it easy to design the common mode filter to attenuate the common mode voltages so that they meet emission requirements. That is, none of the motor windings in the motor are connected to ground. However, for motor drive operating frequencies below the emission requirement limits, it may be difficult to keep the common mode voltage under control because the common mode filter itself has a resonant frequency. If the common mode filter is excited at its resonant frequency, it could generate extremely high common mode voltages on the motor and its associated feeder lines because there is no common mode path to ground. Because the motor drive operates over a wide frequency range, there are opportunities for the motor drive frequency to pass through the common mode filter resonant frequency and excite the common mode filter, thereby creating a risk of motor damage due to the resulting high voltage response.

Harmonics of the voltage output of the motor drive may also create undesirable levels of common mode voltage. Although a harmonic (e.g., a third harmonic) of the fundamental motor drive output voltage may be added to the fundamental motor drive output voltage itself to deliver more of the fundamental voltage to the motor (and therefore make more power available to the motor), the common mode filter will react to the harmonic. This reaction must therefore be addressed in the motor controller design to prevent the common mode filter from generating the high voltage response to the harmonic.

There is a desire for a system that provides tighter control over the common mode voltage in a motor controller.

SUMMARY OF THE INVENTION

The present invention is directed to a motor controller having a damper that dampens resonance in a motor drive and prevents a common mode filter from generating a high common mode voltage in response to the motor drive operating at the resonant frequency of the common mode filter. The damper is connected to an output feeder line of a motor drive in the motor controller and provides a common mode path to ground for the common mode filter. Thus, even if the motor drive is operating at a resonant frequency of the common mode filter, the resulting resonance in the common mode filter is attenuated by rather than amplified by the common mode filter.

DETAILED DESCRIPTION OF THE EMBODIMENTS

Figure 1:
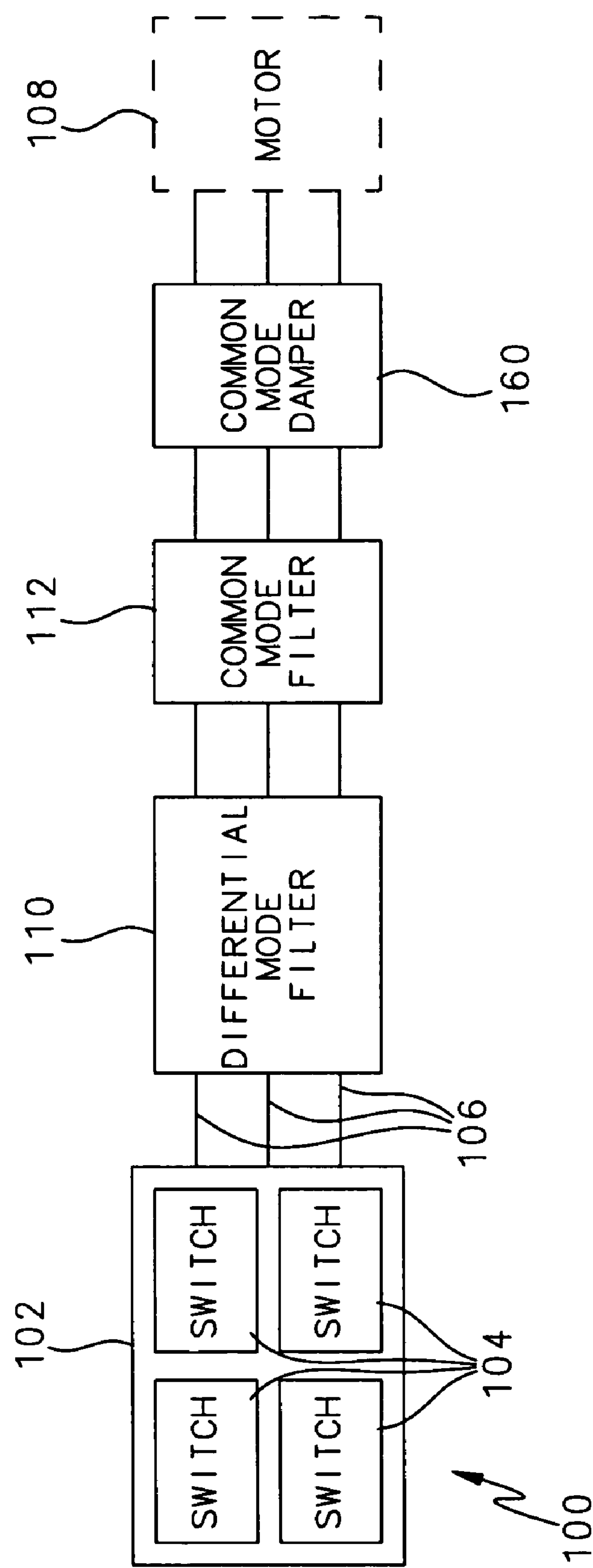
FIG. 1 is a representative diagram of a motor drive system according to one embodiment of the invention.

FIG. 1 is a representative block diagram of an output portion of a motor controller 100 according to one embodiment of the invention. The motor controller 100 includes a motor drive 102 having one or more switches 104 and a plurality of output feeder lines 106 that connect to a motor 108. In the illustrated example, the motor 108 is a three-phase motor and each output feeder line 106 corresponds to one of the phases of the motor 108.

An optional differential mode filter 110 may be connected to each output feeder line 106 to protect the motor 108 from voltage and current spikes. In the example shown in FIG. 2, the differential mode filters 110 comprise inductors and capacitors, but any other components may be used as the differential mode filters 110. Note that the differential mode filters 110 shown in this example are merely for illustrative purposes only and may be omitted from the motor controller 100 without departing from the scope of the invention.

A common mode filter 112 is connected to the output feeder lines 106 to attenuate the common mode elements of the chop frequency and its associated harmonics, as described above, to levels low enough to meet typical EMI emission limit requirements. The common mode filter 112 itself may be any low pass filter. In the example shown in FIG. 2, each output feeder line 106 has its own associated common mode filter 112 comprising a common mode inductor 150 and a common mode capacitor 152 coupled together as a low-pass filter. The common mode capacitors 152 all are connected to the system ground. Of course, other filter configurations may be used as the common mode filters 112 without departing from the scope of the invention.

To prevent the common mode filter 112 from being excited when the common mode voltage crosses the resonant frequency of the common mode filter 112, a damper 160 is also coupled to the output feeder lines 106. The example shown in FIG. 2 includes a damper 160 connected to all of the output feeder lines 106. The damper 160 is designed to damp a given single line LC low pass filter (i.e., the common mode filter 112) by including a damping resistor 162 in parallel or series with the common mode inductor 150 or in parallel or series with the common mode capacitor 152. The connection of the components in the damper 160 with respect to the components in the common mode filter 112 will influence the amount of attenuation in the common mode filter 112; thus, it is desirable to connect the damper 160 in a manner that maintains or even improves the attenuation performance of the common mode filter 112.

Figure 2:
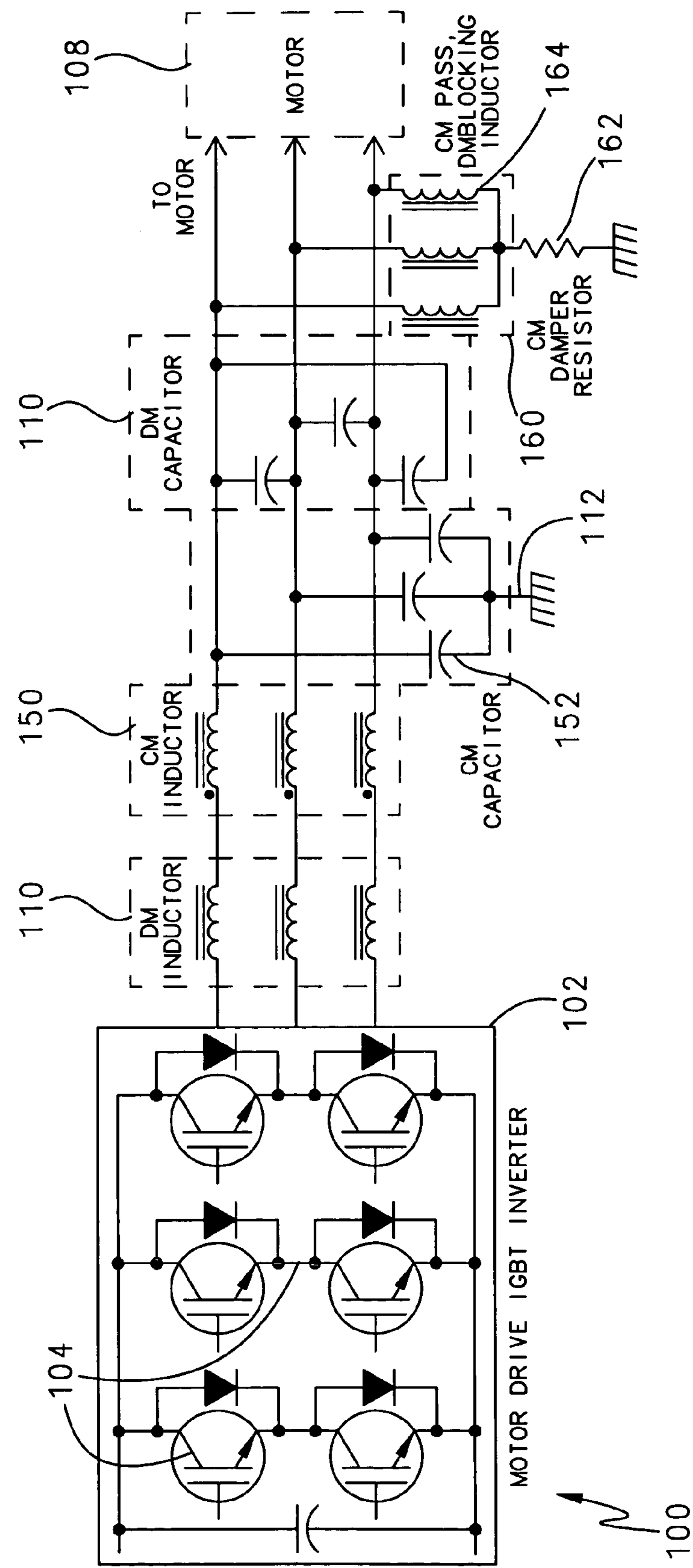
FIG. 2 is a representative diagram of one embodiment of the inventive motor drive system in greater detail.

The embodiment shown in FIG. 2 has the damping resistor 162 connected in parallel with the common mode capacitors 152. This enhances the attenuation performance of the common mode filter 112, but may cause power dissipation as well, particularly when the damping resistor 162 is selected to be small enough to provide good damping characteristics. To prevent this power dissipation while still maintaining acceptable damping, the damper 160 may connect the damping resistor 162 in parallel with the common mode capacitors 152 through an electromagnetic device, such as a neutral forming transformer 164, as shown in FIG. 2. The neutral forming transformer 164 is a three-phase inductor connected to all three output feeder lines 106 and having a high differential mode (magnetizing) inductance and a low common mode (leakage) inductance.

The neutral forming transformer 164 blocks all the differential mode voltage from the damping resistor 162 and allows only common mode voltage to reach the damping resistor 162. As a result, the damper 160 is able to provide the correct amount of common mode damping while minimizing any possible power dissipation in the damping resistor 162.

By incorporating a damper at the output feeder lines of a motor drive, the invention prevents the common mode filter from being excited when the motor drive operates at the resonant frequency of the common mode filter, thereby keeping the common mode voltage under tight control. This ensures that the common mode voltage is kept low enough to prevent any damage to a motor and its associated feeder lines.

It should be understood that various alternatives to the embodiments of the invention described herein may be employed in practicing the invention. It is intended that the following claims define the scope of the invention and that the method and apparatus within the scope of these claims and their equivalents be covered thereby.

What is claimed is:

1. A motor controller, comprising:

a motor drive with at least one switch;

an output feeder line that is connectable between the motor drive and a motor;

a common mode filter coupled to the output feeder line;

a damper coupled to the common mode filter, the damper comprises a damping resistor connected between the common mode filter and ground, and further comprising an electromagnetic device connected between the common mode filter and the damping resistor.

2. The motor contoller of claim 1, wherein the motor is a multi-phase motor, and wherein the output feeder line comprises a plurality of output feeder lines, each feeder line corresponding to a phase of the motor.

3. The motor controller of claim 1, wherein the motor is a multi-phase motor, wherein the output feeder line comprises a plurality of output feeder lines, each output feeder line corresponding to a phase of the motor, and wherein the electromagnetic device is a neutral forming transformer having a plurality of windings associated with said plurality of output feeder lines.

4. The motor controller of claim 1, further comprising a differential node filter coupled to the output feeder line.

5. The motor controller of claim 1, wherein the common mode filter comprises a low pass filter having a common mode inductor and a common mode capacitor, and wherein the damping resistor is connected in parallel with the common mode capacitor.

6. A motor controller, comprising:

a motor drive with at least one switch;

an output feeder line that is connectable between the motor drive and a motor;

a common mode filter coupled to the output feeder line; and a damper coupled to the common mode filter, the damper comprising a damping resistor connected between the common mode filter and ground; and the common mode filter comprises a low pass filter having a common mode inductor and a common mode capacitor, and wherein the damping resistor is connected in parallel with the common mode capacitor.

7. The motor controller of claim 6 wherein the damper further comprises an electromagnetic device connected between the common mode filter and the damping resistor.

8. A system comprising:

a three-phase motor; and a motor controller having a motor drive with a plurality of switches, a plurality of output feeder lines, each output feeder line associated with one or the phases in the three-phase motor, at least one common mode filter coupled to at least one of said plurality of output feeder lines, a damper coupled to said at least one common mode filter, the damper comprising a damping resistor connected between the common mode filter and ground, and further comprising an electromagnetic device connected between the common mode filter and the damping resistor.

9. The system of claim 8, wherein the electromagnetic device is a neutral forming transformer having a plurality of windings, each winding connected to one of said plurality of output feeder lines.

10. The system of claim 8, wherein said at least one common mode filter comprises a plurality of common mode filters, each common mode filter associated with one of the phases in the three-phase motor, wherein each of said plurality of common mode filters comprises a low pass filter having a common mode inductor and a common mode capacitor, and wherein the damping resistor is connected in parallel with at least one of the common mode capacitors.

11. A system comprising:

a three-phase motor; and a motor controller having a motor drive with a plurality of switches, a plurality of output feeder lines, each output feeder line associated with one of the phases in the three-phase motor, at least one common mode filter coupled to at least one of said plurality of output feeder lines, a damper coupled to said at least one common mode filter, wherein the damper comprises a damping resistor connected between the common mode filter and ground; and said at least one common mode filter comprises a plurality of common mode filters, each common mode filter associated with one of the phases in the three-phase motor, wherein each of said plurality of common mode filters comprises a low pass filter having a common mode inductor and a common mode capacitor, and wherein the damping resistor is connected in parallel with at least one of the common mode capacitors.

12. The system of claim 11, wherein the damper further comprises an electromagnetic device connected between the common mode filter and the damping resistor.

13. The system of claim 10, further comprising at least one differential mode filter coupled to at least one of said plurality of output feeder lines.

14. A method of controlling a motor connected to a motor drive, comprising:

switching a plurality of switches in the motor drive to generate a motor drive output having a common mode voltage;

filtering the motor drive output to attenuate the common mode voltage;

damping the common mode voltage, wherein the damping further comprises incorporation of an electromagnetic device between the common mode filter and a damning resistor, with the damping resistor being connected between the common mode filter and ground; and applying the damped common mode voltage to the motor.

* * * * *

UNITED STATES PATENT AND TRADEMARK OFFICE

CERTIFICATE OF CORRECTION

PATENT NO. : 7,068,005 B2
APPLICATION NO. : 10/929804
DATED : August 30, 2004
INVENTOR(S) : Donal E. Baker It is certified that error appears in the above-identified patent and that said Letters Patent is hereby corrected as shown below:

Column 4, Line 42: Please delete “or” and insert --of--

Column 6, Line 14: Please delete “damning” and insert --damping--

Signed and Sealed this

Fourteenth Day of November, 2006

JON W. DUDAS
*Director of the United States Patent and Trademark Office*

UNITED STATES PATENT AND TRADEMARK OFFICE

CERTIFICATE OF CORRECTION

PATENT NO. : 7,068,005 B2
APPLICATION NO. : 10/929804
DATED : June 27, 2006
INVENTOR(S) : Donal E. Baker It is certified that error appears in the above-identified patent and that said Letters Patent is hereby corrected as shown below:

Column 4, Line 42: Please delete "or" and insert --of--

Column 6, Line 14: Please delete "damning" and insert --damping--

This certificate supersedes Certificate of Correction issued November 14, 2006.

Signed and Sealed this

Second Day of January, 2007

JON W. DUDAS
*Director of the United States Patent and Trademark Office*